United States Patent
Kim et al.

(10) Patent No.: US 11,556,002 B2
(45) Date of Patent: Jan. 17, 2023

(54) LASER ANNEALING APPARATUS AND METHOD OF MANUFACTURING SUBSTRATE HAVING POLY-SI LAYER USING THE SAME

(71) Applicant: Samsung Display Co., Ltd., Yongin-si (KR)

(72) Inventors: Jihwan Kim, Yongin-si (KR); Jongjun Baek, Yongin-si (KR); Byungsoo So, Yongin-si (KR); Hiroshi Okumura, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 214 days.

(21) Appl. No.: 16/802,011

(22) Filed: Feb. 26, 2020

(65) Prior Publication Data
US 2021/0033853 A1     Feb. 4, 2021

(30) Foreign Application Priority Data

Jul. 30, 2019    (KR) .................. 10-2019-0092661

(51) Int. Cl.
| | | |
|---|---|---|
| G02B 26/12 | (2006.01) | |
| G02F 1/07 | (2006.01) | |
| H01L 21/67 | (2006.01) | |
| H01L 21/02 | (2006.01) | |
| B23K 26/354 | (2014.01) | |

(Continued)

(52) U.S. Cl.
CPC .......... *G02B 26/124* (2013.01); *B23K 26/064* (2015.10); *B23K 26/082* (2015.10); *B23K 26/354* (2015.10); *G02F 1/07* (2013.01); *H01L 21/02532* (2013.01); *H01L 21/02592* (2013.01); *H01L 21/02675* (2013.01); *H01L 21/67115* (2013.01)

(58) Field of Classification Search
None
See application file for complete search history.

(56) References Cited

U.S. PATENT DOCUMENTS

| | | | |
|---|---|---|---|
| 3,402,630 A | * | 9/1968 | Blau ....................... G01S 17/10 356/5.03 |
| 6,697,096 B2 | | 2/2004 | Agorio |
| 7,834,353 B2 | | 11/2010 | Hongo et al. |

(Continued)

FOREIGN PATENT DOCUMENTS

| | | |
|---|---|---|
| JP | 3903761 | 4/2007 |
| JP | 4744700 | 8/2011 |

(Continued)

*Primary Examiner* — Alexander G Ghyka
(74) *Attorney, Agent, or Firm* — Kile Park Reed & Houtteman PLLC

(57) ABSTRACT

Provided are a laser annealing apparatus and a method of manufacturing a substrate having a poly-Si layer using the laser annealing apparatus. The laser annealing apparatus includes a laser beam source that emits a linearly polarized laser beam, a polygon mirror that rotates around a rotation axis and reflects the laser beam emitted from the laser beam source, a first Kerr cell disposed on a laser beam path between the laser beam source and the polygon mirror, and a first optical element that directs the laser beam reflected by the polygon mirror toward an amorphous Si layer where the laser beam is irradiated upon the amorphous Si layer.

8 Claims, 7 Drawing Sheets

(51) Int. Cl.
 *B23K 26/064* (2014.01)
 *B23K 26/082* (2014.01)

(56) References Cited

U.S. PATENT DOCUMENTS 7,859,016 B2 12/2010 Hatano et al.
8,802,580 B2 8/2014 Im
2005/0140925 A1\* 6/2005 Yavid .................... G02B 27/48
353/20

FOREIGN PATENT DOCUMENTS

KR 10-0939043 1/2010
WO 2009/066918 5/2009

\* cited by examiner

LASER ANNEALING APPARATUS AND METHOD OF MANUFACTURING SUBSTRATE HAVING POLY-SI LAYER USING THE SAME

CROSS-REFERENCE TO RELATED APPLICATION

This application claims priority to and benefits of Korean Patent Application No. 10-2019-0092661 under 35 U.S.C. § 119, filed in the Korean Intellectual Property Office on Jul. 30, 2019, the entire contents of which are incorporated herein by reference.

BACKGROUND

1. Technical Field

One or more embodiments relate to a laser annealing apparatus and a method of manufacturing a substrate having a poly-Si layer using the same, and, to a laser annealing apparatus which may obtain a previously intended result such as a uniform annealing of an amorphous Si layer and subsequent uniform poly-Si layer even when an error occurs in the shape of one constituent element, and a method of manufacturing a substrate having a poly-Si layer using the same.

2. Description of Related Art

In general, display apparatuses such as liquid crystal display apparatuses or organic light-emitting display apparatuses use thin film transistors to control the light emission of each pixel. A process of forming a poly-Si layer on a substrate may be included in a process of manufacturing a display apparatus when a thin film transistor includes poly-Si. A poly-Si layer may be formed by forming an amorphous Si layer on a substrate and annealing the same. Annealing may be carried out by irradiating a laser beam onto the amorphous Si layer.

In a laser annealing apparatus according to the related art, when an error occurs in the shape of an optical element located on an optical path of a laser beam, a final optical path of a laser beam differs from a preset optical path. As a result, a defect may be generated as annealing of an amorphous Si layer is performed differently than intended.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a laser annealing apparatus which may obtain a previously intended result even when an error occurs in the shape of one constituent element, and a method of manufacturing a substrate having a poly-Si layer using the same. However, the above objective is non-limiting, and the scope of the disclosure is not limited thereto.

Additional aspects will be set forth in part in the description which follows and, in part, will be apparent from the description, or may be learned by practice of the embodiments of the disclosure.

According to one or more embodiments, a laser annealing apparatus may include a laser beam source that emits a linearly polarized laser beam, a polygon mirror that rotates around a rotation axis and reflects the laser beam emitted from the laser beam source, a first Kerr cell disposed on a laser beam path between the laser beam source and the polygon mirror, and a first optical element that directs the laser beam reflected by the polygon mirror toward an amorphous Si layer where the laser beam is irradiated upon the amorphous Si layer.

The polygon mirror may include a first reflection surface and a second reflection surface, a first potential difference may be applied to the first Kerr cell while the laser beam emitted from the laser beam source is incident on the first reflection surface, a second potential difference may be applied to the first Kerr cell while the laser beam emitted from the laser beam source is incident on the second reflection surface, and the first potential difference may be different from the second potential difference.

The polygon mirror may include a first reflection surface and a second reflection surface, and a second potential difference applied to the first Kerr cell may vary while the polygon mirror rotates and the laser beam emitted from the laser beam source is incident on the second reflection surface.

A linear polarization direction of the laser beam emitted from the laser beam source may be in a plane parallel to a direction of an electric field generated in the first Kerr cell, and including a linear path of the laser beam incident on the first Kerr cell, and the linear polarization direction may be perpendicular to the linear path of the laser beam incident on the first Kerr cell.

The laser annealing apparatus may further include a second optical element disposed on a laser beam optical path between the first Kerr cell and the polygon mirror, and the second optical element makes an incidence point on the polygon mirror of the laser beam after passing through the first Kerr cell identical to an incidence point on the polygon mirror of the laser beam emitted from the laser beam source when the first Kerr cell is not disposed between the laser beam source and the polygon mirror. Furthermore, a direction of an electric field generated in the first Kerr cell may be perpendicular to a rotation axis of the polygon mirror.

The laser annealing apparatus may further include a second Kerr cell disposed on a laser beam path between the first Kerr cell and the polygon mirror, and a half-wave ($\lambda/2$) plate disposed on a laser beam path between the second Kerr cell and the first Kerr cell, wherein a direction of an electric field generated in the second Kerr cell is perpendicular to a direction of an electric field generated in the first Kerr cell.

The first optical element may include a first mirror having a convex reflection surface and a second mirror having a concave reflection surface.

The second optical element may include a first lens that is convex toward the polygon mirror and a second lens that is convex toward the second Kerr cell.

One or more embodiments include a method of manufacturing a substrate having a poly-Si layer, which may include forming an amorphous Si layer on a substrate, and irradiating a linearly polarized laser beam onto the amorphous Si layer after the linearly polarized laser beam passes through a first Kerr cell, is reflected by a polygon mirror that rotates around a rotation axis, and impinges on a first optical element.

The method may further include moving the substrate in a predetermined direction while rotating the polygon mirror.

In the irradiating of the laser beam onto the amorphous Si layer, the laser beam may be irradiated onto the amorphous Si layer, applying a first potential difference to the first Kerr cell while the laser beam is incident on a first reflection surface of the polygon mirror, and applying a second potential difference to the first Kerr cell while the laser beam is incident on a second reflection surface of the polygon mirror, wherein the first and second potential differences differ from each other.

In the irradiating of the laser beam, the laser beam may be irradiated onto the amorphous Si layer by varying a second potential difference applied to the first Kerr cell while the polygon mirror rotates and the laser beam is incident on a second reflection surface of the polygon mirror.

In the irradiating of the laser beam, the laser beam having a linear polarization direction may be irradiated onto the amorphous Si layer through the first Kerr cell, wherein the linear polarization direction may be in a plane parallel to a direction of an electric field generated in the first Kerr cell, disposed in a plane including a linear path of the laser beam incident on the first Kerr cell, and perpendicular to the linear path of the laser beam incident on the first Kerr cell.

In the irradiating of the laser beam, the laser beam may be irradiated onto the amorphous Si layer by passing through a second optical element between the first Kerr cell and the polygon mirror, the second optical element makes an incidence point on the polygon mirror of the laser beam after passing through the first Kerr cell identical to an incidence point on the polygon mirror of the laser beam when the first Kerr cell is not disposed between the laser beam source and the polygon mirror.

In the irradiating of the laser beam, a direction of an electric field generated in the first Kerr cell may be perpendicular to the rotation axis of the polygon mirror.

In the irradiating of the laser beam, the laser beam may be irradiated onto the amorphous Si layer by sequentially passing through first Kerr cell, a half-wave ($\lambda/2$) plate, and a second Kerr cell to be incident on the polygon mirror, and a direction of an electric field generated in the second Kerr cell is perpendicular to a direction of an electric field generated in the first Kerr cell.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
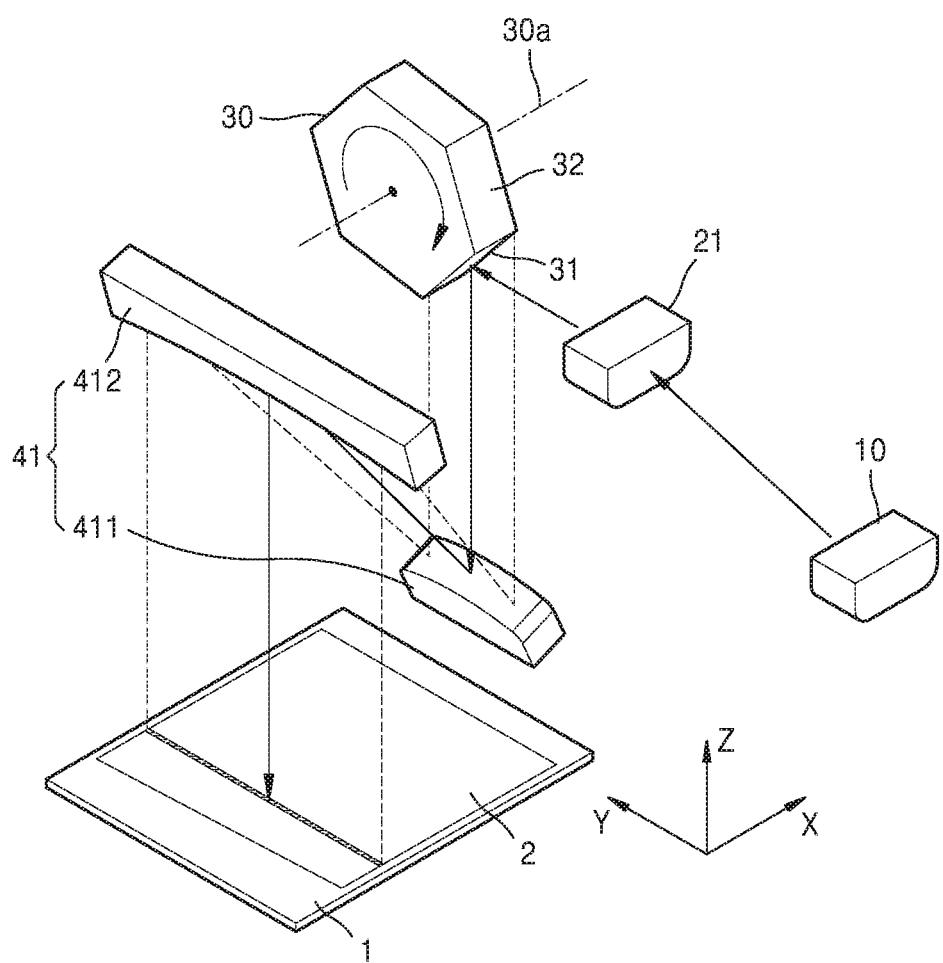
FIG. 1 is a schematic diagram of a laser annealing apparatus according to an embodiment.

Reference will now be made to embodiments, examples of which are illustrated in the accompanying drawings. In this regard, the embodiments may have different forms and should not be construed as being limited to the descriptions set forth herein. Accordingly, the embodiments are described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure will now be described more fully with reference to the accompanying drawings, in which embodiments of the disclosure are shown. Throughout the drawings, like reference numerals denote like elements and redundant descriptions thereof are omitted.

In the embodiments below, it will be understood that when a component, such as a layer, a film, a region, or a plate, is referred to as being "on" another component, the component can be directly on the other component or intervening components may be present thereon. Furthermore, for convenience of explanation, sizes of components in the drawings may be exaggerated for clarity. For example, since sizes and thicknesses of components in the drawings are arbitrarily illustrated for convenience of explanation, the following embodiments are not limited thereto.

In the following examples, the X, the Y and the Z are not limited to three axes of the rectangular coordinate system, and may be interpreted in a broader sense. For example, the X, the Y, and the Z may be perpendicular to one another, or may represent different directions that are not perpendicular to one another.

The terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic diagram of a laser annealing apparatus according to an embodiment. As illustrated in FIG. 1, the laser annealing apparatus according to the embodiment may include a laser beam source 10, a polygon mirror 30, a first Kerr cell 21, and a first optical element 41.

The laser beam source 10 may emit a linearly polarized laser beam. The laser beam source 10 may include a typical laser beam source and a linear polarizing plate. For example, a fiber laser may be used as the laser beam source 10. The fiber laser has characteristics such as wide range output adjustment, low maintenance costs, and high efficiency. The laser beam source may be any other laser beam source as may be understood and appreciated by those of ordinary skill in the art.

The polygon mirror 30 reflects an incident laser beam output from the laser beam source 10, and the polygon mirror 30 may rotate around a rotation axis 30a. The laser beam emitted from the laser beam source 10 is reflected by the polygon mirror 30 and then arrives at or is incident upon an amorphous Si (silicon) layer 2 on a substrate 1 that may be placed on a stage (not shown). Accordingly, the amorphous Si layer 2 is annealed to be a poly-Si layer.

By rotating the polygon mirror 30, a laser beam may be irradiated onto the entire area or most of the area of the amorphous Si layer 2. The laser beam reflected by the polygon mirror 30 may be irradiated onto the amorphous Si layer 2, and as the polygon mirror 30 rotates, a point on the amorphous Si layer 2, at which the laser beam arrives or is incident upon, may vary. As illustrated in FIG. 1, when the laser beam emitted from the laser beam source 10 arrives at or is incident upon a first reflection surface 31 of the polygon mirror 30, as the polygon mirror 30 rotates around the rotation axis 30a in a direction indicated by an arrow, the point on the amorphous Si layer 2 at which the laser beam arrives or is incident upon is moved approximately in a +Y direction. As the polygon mirror 30 further rotates or continues to rotate and thus the laser beam emitted from the laser beam source 10 arrives at or is incident upon a second reflection surface 32 of the polygon mirror 30, when the polygon mirror 30 rotates around the rotation axis 30a in the direction indicated by the arrow, the laser beam is irradiated again along an area of an upper surface of the amorphous Si layer 2, on which the laser beam reflected by the first reflection surface 31 of the polygon mirror 30 has been irradiated. Accordingly, by moving the substrate 1 in a −X direction by using the stage while rotating the polygon mirror 30, the laser beam may be finally irradiated onto the entire area or most of the area of the amorphous Si layer 2.

Although the laser beam reflected by the polygon mirror 30 may directly arrive at or be incident upon the amorphous Si layer 2, as illustrated in FIG. 1, the laser beam may arrive at or be incident upon the amorphous Si layer 2 by adjusting the path of the laser beam reflected by the polygon mirror 30 using the first optical element 41. In FIG. 1, the first optical element 41 may include a first mirror 411 having a convex reflection surface and a second mirror 412 having a concave reflection surface. In case that a laser beam is reflected from a point at the first reflection surface 31 which is far from the second reflection surface 32, the laser beam may be irradiated around an edge of the amorphous Si layer 2 in a −Y direction. In case that a laser beam is reflected from a point at the first reflection surface 31 which is adjacent to the second reflection surface 32, the laser beam may be irradiated around an edge of the amorphous Si layer 2 in a +Y direction. Accordingly, when the laser beam is reflected by the first reflection surface 31 while the polygon mirror 30 rotates, the length of an area of the amorphous Si layer 2 where the laser beam is irradiated corresponds to or substantially the same as the width of the amorphous Si layer 2 in a Y direction.

Figure 2:
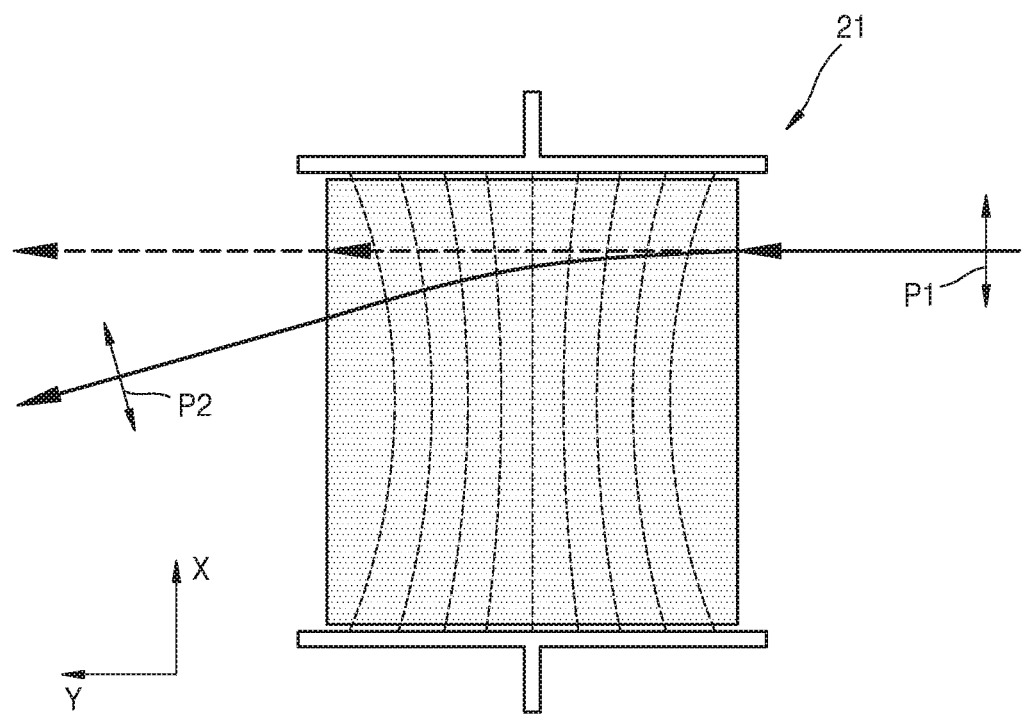
FIG. 2 is a schematic diagram showing a change in the path of a laser beam in a constituent element of FIG. 1.

The first Kerr cell 21 may be located or disposed on the path of a laser beam between the laser beam source 10 and the polygon mirror 30. FIG. 2 is a schematic diagram of a change in the path of a laser beam in the first Kerr cell 21 of FIG. 1. The first Kerr cell 21 may control a refractive index of a material inside of the first Kerr cell 21 by adjusting the intensity of an electric field applied to the inside thereof. In other words, birefringence may be generated in the first Kerr cell 21 due to the effect of an electric field. The first Kerr cell 21 may include a material in which birefringence varies according to the intensity of an electric field. For example, the first Kerr cell 21 may have a liquid of a derivative such as nitrobenzene and a pair of electrodes for applying an electric field to the liquid of a derivative. The liquid or the liquid of the derivative may be any material as may be understood and appreciated by those of ordinary skill in the art and is not limited to nitrobenzene. When the first Kerr cell 21 is used, a refractive index of the material inside thereof may be controlled by adjusting the intensity of an electric field, and thus the path of a laser beam passing through the first Kerr cell 21 may be controlled.

In FIG. 2, the path of a laser beam may be changed as the laser beam travels along a path indicated by a dashed line when no electric field is applied to the inside of the first Kerr cell 21, and the laser beam travels along a path indicated by a solid line when an electric field is applied. A degree of a change in the path of a laser beam may vary according to the intensity of an applied electric field.

To control the path of a laser beam by using the first Kerr cell 21, it is necessary to appropriately set a linear polarization direction of the laser beam and a direction of the electric field. As shown in FIG. 2, a linear polarization P1 direction of the laser beam emitted from the laser beam source 10 may be in a plane (X-Y plane) parallel or approximately parallel to the direction (X direction) of an electric field generated in the first Kerr cell 21 and including a linear path of the laser beam incident on the first Kerr cell 21, and may be perpendicular to the linear path of the laser beam incident on the first Kerr cell 21. Also, a linear polarization P2 direction of the laser beam having passed through the first Kerr cell 21 may be in a plane parallel or approximately parallel to the direction (X direction) of the electric field generated in the first Kerr cell 21 and including a linear path of the laser beam having passed through the first Kerr cell 21, and may be perpendicular to the linear path of the laser beam having passed through the first Kerr cell 21.

Figure 3:
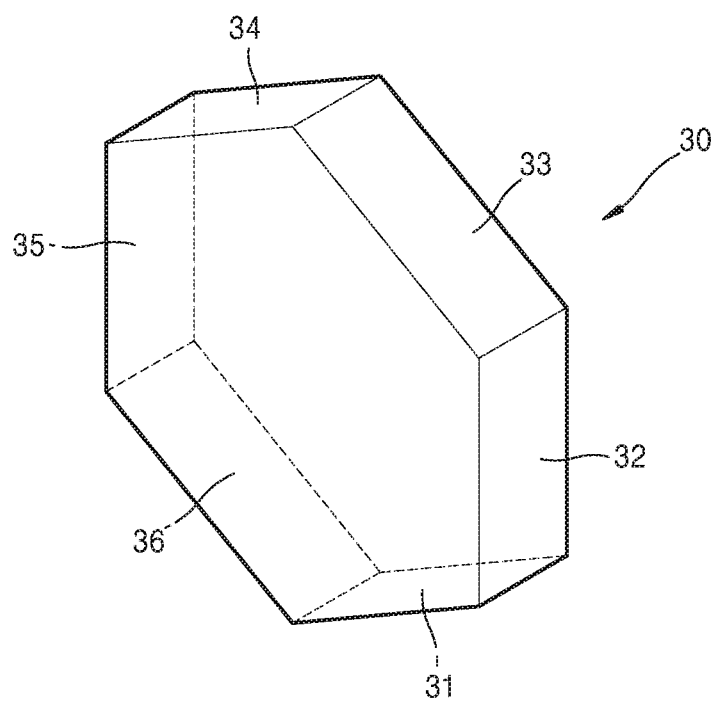
FIG. 3 is a schematic perspective view of a polygon mirror that is a constituent element of FIG. 1.

FIG. 3 is a schematic perspective view of the polygon mirror 30 that may be a constituent element of FIG. 1. In FIG. 3, the polygon mirror 30 may have the first reflection surface 31 to a sixth reflection surface 36. However, the disclosure is not limited thereto and the polygon mirror 30 may have any number of reflection surfaces. When the polygon mirror 30 has an ideally previously set or configured shape, laser beam path adjustment using the first Kerr cell 21 may be unnecessary. However, in the process of manufacturing a laser annealing apparatus, the polygon mirror 30 may not have an ideally previously set or configured shape, and the polygon mirror 30 may be deformed in the process of using the laser annealing apparatus. For example, the path of the laser beam reflected by the polygon mirror 30 may not follow a previously set or configured path, and thus a defect may be generated in the annealing of the amorphous Si layer 2. In other words, defects in constituent elements of the laser annealing apparatus may result in defects in the annealing of the amorphous Si layer 2.

However, the laser annealing apparatus according to the embodiment has the first Kerr cell 21 as described above. Accordingly, by adjusting the path of a laser beam incident on the polygon mirror 30 by using the first Kerr cell 21, the path of the laser beam after being reflected by the polygon mirror 30 follows the previously set or configured path so as to effectively prevent generation of a defect or reduce a degree of a generation of a defect. In other words, the Kerr cell may compensate for defects in constituent elements of the laser annealing apparatus.

Figure 4:
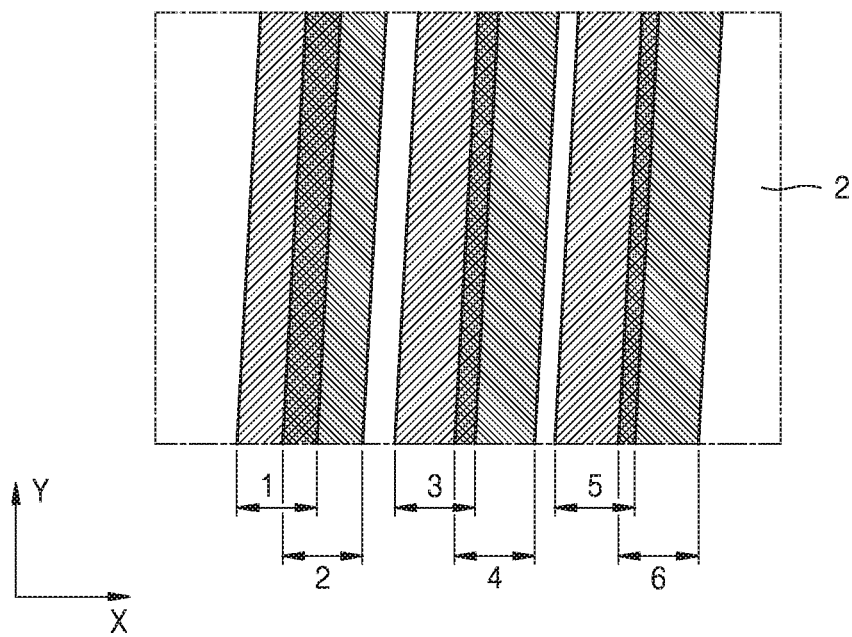
FIG. 4 is a schematic diagram of a trace of a laser beam irradiated onto an amorphous Si layer when an error occurs in the shape of an optical element located or disposed on an optical path of the laser beam.

FIG. 4 is a schematic diagram of a trace of a laser beam irradiated onto the amorphous Si layer 2 when an error occurs in the shape of the polygon mirror 30 located or disposed on an optical path of the laser beam. In FIG. 4, '1' denotes an area where the laser beam reflected by the first reflection surface 31 of the polygon mirror 30 is irradiated, '2' denotes an area where the laser beam reflected by the second reflection surface 32 of the polygon mirror 30 is irradiated, '3' denotes an area where the laser beam reflected by a third reflection surface 33 of the polygon mirror 30 is irradiated, '4' denotes an area where the laser beam reflected by a fourth reflection surface 34 of the polygon mirror 30 is irradiated, '5' denotes an area where the laser beam reflected by a fifth reflection surface 35 of the polygon mirror 30 is irradiated, and '6' denotes an area where the laser beam reflected by the sixth reflection surface 36 of the polygon mirror 30 is irradiated.

In order to anneal the amorphous Si layer 2 without defects, the laser beam needs to be uniformly irradiated onto the entire area or most the area of the amorphous Si layer 2. However, when the surfaces of the polygon mirror 30 do not have an ideal shape or configuration and the first Kerr cell 21 is not used, as illustrated in FIG. 4, the size of an overlapping portion between an area 1 where the laser beam reflected by the first reflection surface 31 of the polygon mirror 30 is irradiated and an area 2 where the laser beam reflected by the second reflection surface 32 of the polygon mirror 30 is irradiated, may be different from the size of an overlapping portion between an area 3 where the laser beam reflected by the third reflection surface 33 of the polygon mirror 30 is irradiated and an area 4 where the laser beam reflected by the fourth reflection surface 34 of the polygon mirror 30 is irradiated. Furthermore, as the area 2 where the laser beam reflected by the second reflection surface 32 of the polygon mirror 30 is irradiated and the area 3 where the laser beam reflected by the third reflection surface 33 of the polygon mirror 30 is irradiated, do not overlap with each other, the laser beam may not be irradiated onto a part of the amorphous Si layer 2. When the above phenomenon occurs, the polygon mirror 30 needs to be replaced, and thus manufacturing costs may be substantially increased and/or maintenance/repair costs of a laser annealing apparatus may substantially increase.

However, for the laser annealing apparatus according to the embodiment, by controlling the path of a laser beam through the first Kerr cell 21, the generation of an annealing defect on an amorphous Si layer may be effectively prevented or reduced. For example, for the laser annealing apparatus illustrated in FIGS. 1 and 2, by adjusting the intensity of an electric field in the X direction in the first Kerr cell 21, a degree of bending of the laser beam having passed through the first Kerr cell 21 in the X direction may be controlled, and thus the location of an incident position of the laser beam in the X direction when incident on the amorphous Si layer 2 may be controlled.

Figure 5:
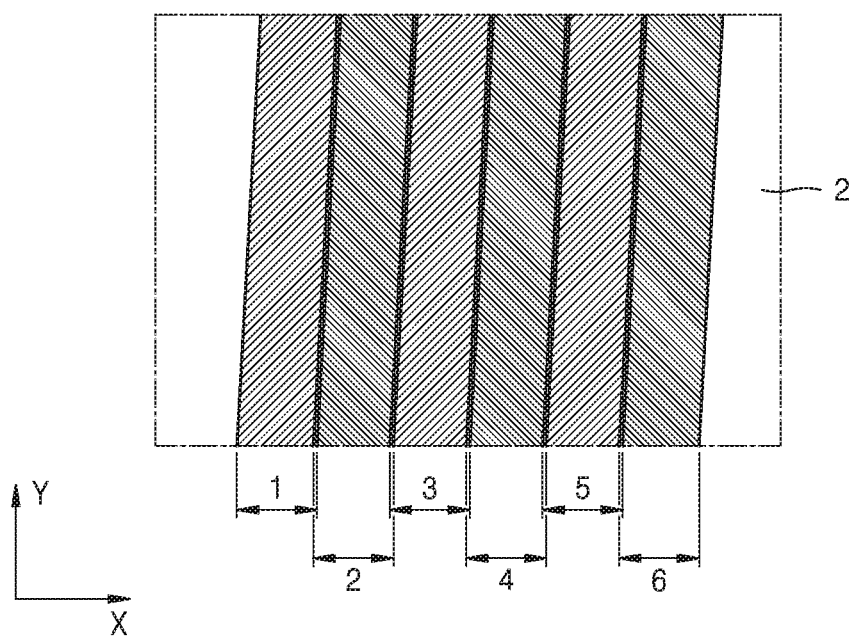
FIG. 5 is a schematic diagram of a trace of a laser beam irradiated onto an amorphous Si layer when an error is corrected by using the laser annealing apparatus of FIG. 1.

As illustrated in FIG. 4, when an overlapping area between the area 1 where the laser beam reflected by the first reflection surface 31 of the polygon mirror 30 is irradiated and the area 2 where the laser beam reflected by the second reflection surface 32 of the polygon mirror 30 is irradiated is excessively large, the position of the area 2 where the laser beam reflected by the second reflection surface 32 of the polygon mirror 30 is irradiated may be adjusted by adjusting an optical path of the laser beam emitted from the laser beam source 10 that is incident on the second reflection surface 32 of the polygon mirror 30 by using the first Kerr cell 21. For example, a first potential difference applied to the first Kerr cell 21 when the laser beam emitted from the laser beam source 10 is incident on the first reflection surface 31 may be different from a second potential difference applied to the first Kerr cell 21 when the laser beam emitted from the laser beam source 10 is incident on the second reflection surface 32. By adjusting the position of an area where the laser beam is irradiated, an error may be corrected as illustrated in FIG. 5 by using the laser annealing apparatus of FIG. 1. As illustrated in FIG. 5 that is a schematic diagram of a trace of the laser beam irradiated onto the amorphous Si layer 2, the laser beam may be uniformly irradiated onto the amorphous Si layer 2.

For reference, in FIGS. 4 and 5, the area where the laser beam is irradiated is not parallel to the Y axis but inclined because the substrate 1 is moved in the −X direction at a substantially constant velocity by using the stage while rotating the polygon mirror 30 when the laser beam is irradiated.

When an error occurs in the shape of the polygon mirror 30 that is an optical element located or disposed on an optical path of the laser beam, the area 1 where the laser beam reflected by the first reflection surface 31 of the polygon mirror 30 is irradiated and the area 2 where the laser beam reflected by the second reflection surface 32 of the polygon mirror 30 is irradiated may not be parallel to each other. This is illustrated, for example, in FIG. 6 that is a schematic diagram of a trace of the laser beam irradiated onto the amorphous Si layer 2. A potential difference applied to the first Kerr cell 21 may not be maintained constant at a specific value, but may vary appropriately, while the laser beam is incident on the second reflection surface 32 of the polygon mirror 30. Thus, the shape of the area 2 where the laser beam reflected by the second reflection surface 32 of the polygon mirror 30 is irradiated may be deformed or modified to be parallel to the area 1 where the laser beam reflected by the first reflection surface 31 of the polygon mirror 30 is irradiated.

Figure 6:
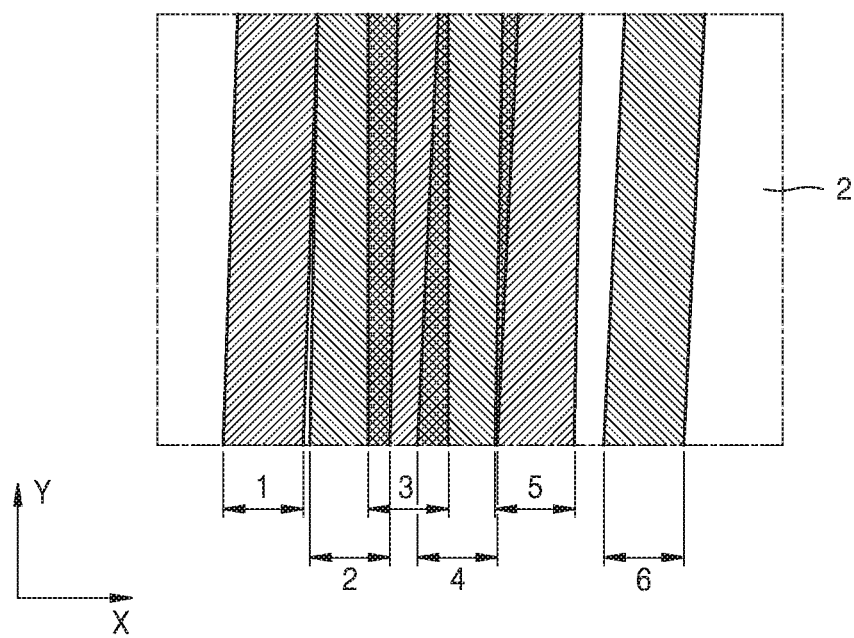
FIG. 6 is a schematic diagram of a trace of a laser beam irradiated onto an amorphous Si layer when an error occurs in the shape of an optical element located or disposed on an optical path of the laser beam.

The potential difference applied to the first Kerr cell 21 while the laser beam is incident on each reflection surface of the polygon mirror 30 may vary or change according to each of the reflection surfaces of the polygon mirror 30. For example, as illustrated in FIG. 6, in the case that all shapes of the areas (1 to 6) formed as the laser beam reflected by the reflection surfaces of the polygon mirror 30 is irradiated onto the amorphous Si layer 2 are different from one another, a change over time in the intensity of an electric field applied to the first Kerr cell 21 may vary as illustrated in FIG. 7.

Figure 7:
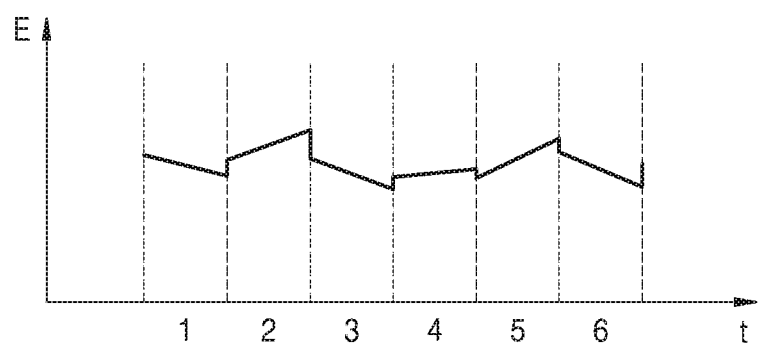
FIG. 7 is a schematic graph of a change over time in the intensity of an electric field applied in one constituent element when an error is corrected by using the laser annealing apparatus of FIG. 1.

In FIG. 7, '1' denotes a change in the intensity of an electric field applied to the first Kerr cell 21 while the laser beam is reflected by the first reflection surface 31 of the polygon mirror 30, '2' denotes a change in the intensity of an electric field applied to the first Kerr cell 21 while the laser beam is reflected by the second reflection surface 32 of the polygon mirror 30, '3' denotes a change in the intensity of an electric field applied to the first Kerr cell 21 while the laser beam is reflected by the third reflection surface 33 of the polygon mirror 30, '4' denotes a change in the intensity of an electric field applied to the first Kerr cell 21 while the laser beam is reflected by the fourth reflection surface 34 of the polygon mirror 30, '5' denotes a change in the intensity of an electric field applied to the first Kerr cell 21 while the laser beam is reflected by the fifth reflection surface 35 of the polygon mirror 30, and '6' denotes a change in the intensity of an electric field applied to the first Kerr cell 21 while the laser beam is reflected by the sixth reflection surface 36 of the polygon mirror 30.

As the position of the area where the laser beam is irradiated may be adjusted by the above described method and laser annealing apparatus, an error may be corrected so that the laser beam may be uniformly irradiated onto the amorphous Si layer 2 as illustrated in FIG. 5.

Figure 8:
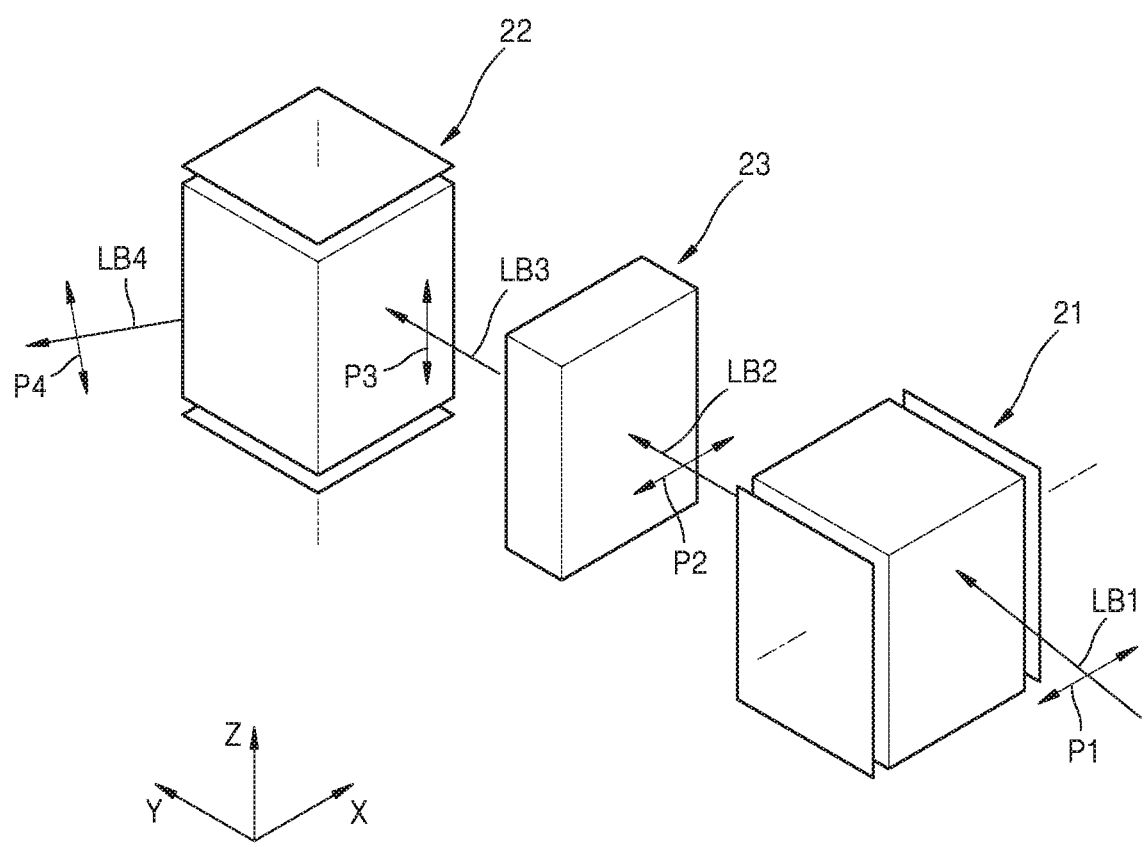
FIG. 8 is a schematic perspective view of a part of a laser annealing apparatus according to an embodiment.

FIG. 8 is a schematic perspective view of a part of a laser annealing apparatus according to an embodiment. The laser annealing apparatus according to the embodiment may differ from the laser annealing apparatus according to the above-described embodiment by the inclusion of a second Kerr cell 22 and a half-wave ($\lambda/2$) plate (or $\lambda/2$ retardation plate) 23. Here, the half-wave ($\lambda/2$) plate is employed in this embodiment, but it is not limited thereto. In other embodiments, similar types of phase difference plate or phase retardation plate may be employed.

The second Kerr cell 22 may be located or disposed on a path of the laser beam between the first Kerr cell 21 and the polygon mirror 30. The second Kerr cell 22 has a structure that is the same as or similar to the structure of the first Kerr cell 21. For example, a direction of an electric field generated in the second Kerr cell 22 may be perpendicular to a direction of an electric field generated in the first Kerr cell 21. The direction of the electric field applied to the first Kerr cell 21 and the direction of the electric field applied to the second Kerr cell 22 may be both perpendicular to an approximate traveling direction (Y direction) of the laser beam. The half-wave ($\lambda/2$) plate 23 may be located or disposed on the path of the laser beam between the second Kerr cell 22 and the first Kerr cell 21.

As described above, the path of the laser beam may be controlled by using the first Kerr cell 21. The direction in which the path of the laser beam is controlled may be approximately a direction in which the electric field is applied, that is, the X direction in FIG. 2. Accordingly, when the path of the laser beam needs to be controlled approximately in a Z direction, it may not be easy to effectively control the path of the laser beam with the first Kerr cell 21 only. In the laser annealing apparatus according to the embodiment, the second Kerr cell 22 may be provided in addition to the first Kerr cell 21. For example, the direction of the electric field generated in the second Kerr cell 22 may be perpendicular to the direction of the electric field generated in the first Kerr cell 21. Accordingly, by using the first Kerr cell 21 and the second Kerr cell 22, the path of the laser beam may be effectively controlled approximately not only in the X direction, but also in the Z direction.

As described above, it is important to appropriately set the linear polarization direction of the laser beam and the direction of the electric field of each of the first Kerr cell 21 and the second Kerr cell 22. In order to control the path of the laser beam by using the first Kerr cell 21, the linear polarization P1 direction of the laser beam emitted from the laser beam source 10 may need to be in a plane (X-Y plane) parallel to the direction (X direction) of the electric field generated in the first Kerr cell 21 and including the linear path of the laser beam incident on the first Kerr cell 21, and to be perpendicular to the linear path of the laser beam incident on the first Kerr cell 21. The linear polarization P2 direction of the laser beam having passed through the first Kerr cell 21 may also be in a plane parallel to the direction (X direction) of the electric field generated in the first Kerr cell 21 and including the linear path of the laser beam having passed through the first Kerr cell 21, and may be perpendicular to the linear path of the laser beam having passed through the first Kerr cell 21.

In order to control the path of the laser beam by using the second Kerr cell 22, as illustrated in FIG. 8, a linear polarization P3 direction of the laser beam incident on the second Kerr cell 22 may need to be in a plane (approximately, a Y-Z plane) parallel to a direction (Z direction) of the electric field generated in the second Kerr cell 22 and including the linear path of the laser beam incident on the second Kerr cell 22, and to be perpendicular to the linear path of the laser beam incident on the second Kerr cell 22. To this end, the laser beam LB2 having passed through the first Kerr cell 21 may pass through the half-wave ($\lambda/2$) plate 23 before being incident on the second Kerr cell 22. A phase delay axis (also known as a slow axis) of the half-wave ($\lambda/2$) plate 23 may form an angle of approximately or about 45° with the linear polarization P2 direction of the laser beam LB2 having passed through the first Kerr cell 21. Accordingly, while the laser beam LB2 having passed through the first Kerr cell 21 passes through the half-wave ($\lambda/2$) plate 23, the linear polarization direction of the laser beam LB2 may rotate approximately or about 90°, and thus as illustrated in FIG. 8, the laser beam LB3 incident on the second Kerr cell 22 may have a linear polarization P3.

The linear polarization P4 direction of the laser beam having passed through the second Kerr cell 22 may also be in a plane (approximately, the Y-Z plane) parallel to the direction (Z direction) of the electric field generated in the second Kerr cell 22 and including a linear path of a laser beam LB4 having passed through the second Kerr cell 22, and may be perpendicular to the linear path of the laser beam LB4 having passed through the second Kerr cell 22.

Figure 9:
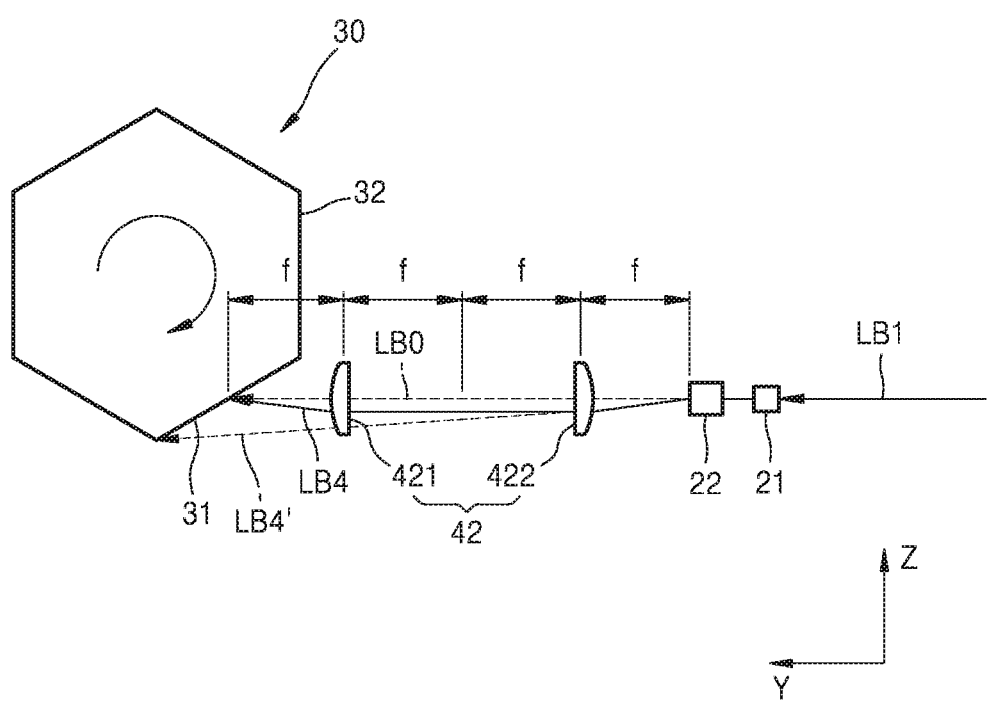
FIG. 9 is a schematic diagram of a part of laser annealing apparatus according to an embodiment.

FIG. 9 is a schematic diagram of a part of a laser annealing apparatus according to an embodiment. In FIG. 9, illustrated are the elements for the purpose of convenience of explanation. The laser annealing apparatus in the embodiment of FIG. 9 includes a second optical element 42. The second optical element 42 may be located or disposed on a laser beam optical path between the second Kerr cell 22 and the polygon mirror 30. The second optical element 42 allows an incidence point on the polygon mirror 30 on which a laser beam LB1 emitted from a laser beam source and passing through the second Kerr cell 22 is incident to be identical or substantially identical to an incidence point on the polygon mirror 30 on which the laser beam emitted from a laser beam source is incident in case that the second Kerr cell 22 and the first Kerr cell 21 do not exist. The optical path of the laser beam LB1 may not be controlled by the first and/or second Kerr cells 21 and/or 22 by employing the second optical element 42.

As described above with reference to FIG. 8, the second Kerr cell 22 may control the optical path of a laser beam in the Z direction, and thus the path of a laser beam (LB4', see FIG. 9) after passing through the second Kerr cell 22 may differ from the path of a laser beam LB0 in case that the second Kerr cell 22 and the first Kerr cell 21 do not exist or the optical path of a laser beam is not controlled. Accordingly, the incidence point on the polygon mirror 30 of the laser beam LB1 emitted from the laser beam source 10 and passed through the second Kerr cell 22 may differ from the incidence point on the polygon mirror 30 of the laser beam emitted from the laser beam source 10 in case that the second Kerr cell 22 and the first Kerr cell 21 do not exist or the optical path of a laser beam is not controlled. When the second Kerr cell 22 changes the path of a laser beam approximately in a Z direction, as illustrated in FIG. 1, as the laser beam is irradiated onto the amorphous Si layer 2, the length in the Y direction of an area onto which the laser beam is irradiated may decrease, and thus an area where the laser beam is not irradiated may exist in the amorphous Si layer 2.

However, the laser annealing apparatus according to the embodiment may include the second optical element 42. The second optical element 42 allows the incidence point on the polygon mirror 30 of the laser beam LB1 emitted from the laser beam source 10 and passed through the second Kerr cell 22 to be identical or substantially identical to the incidence point on the polygon mirror 30 of the laser beam emitted from the laser beam source 10 in case that the second Kerr cell 22 and the first Kerr cell 21 does not exist or do not change the optical path of the laser beam. In other words, the second optical element 42 changes the path of the laser beam having passed through the second Kerr cell 22 from the path of the laser beam LB4' to the path of the laser beam LB4. Accordingly, the problem that a decrease of the length in the Y direction of the area of the amorphous Si layer 2 where the laser beam is irradiated may be prevented from being generated or reduced.

The second optical element 42, for example, as illustrated in FIG. 9, may include a first lens 421 that is convex in a direction toward the polygon mirror 30 and a second lens 422 that is convex in a direction toward the second Kerr cell 22. A focal length f of the first lens 421 and a focal length f of the second lens 422 may be identical or substantially identical to each other. A distance between the second Kerr cell 22 and the second lens 422 corresponds to the focal length f. A distance between the first lens 421 and the second lens 422 may be twice the focal length f. A distance between the first lens 421 and a point on the polygon mirror 30 at which the laser beam arrives or is incident upon may be approximately the focal length f. The direction (approximately, Z direction) of the electric field generated in the second Kerr cell 22 is perpendicular to the rotation axis 30a of the polygon mirror 30.

For reference, although FIG. 9 illustrates that the laser annealing apparatus includes the second Kerr cell 22 and the first Kerr cell 21, the number of Kerr cells may not be important in the embodiment. It is important in the embodiment that the laser annealing apparatus includes a Kerr cell that controls the path of a laser beam approximately in the Z direction. In FIG. 9, the second Kerr cell 22 is described as one that performs such a function. However, referring to the Kerr cells as first and or second is arbitrary, the Kerr cell may be referred to as the first Kerr cell for convenience of explanation.

In the above-described embodiments, actuators capable of adjusting the positions of the first Kerr cell 21, the second Kerr cell 22, and/or the half-wave ($\lambda/2$) plate 23 in a three-dimensional space may be provided.

For example, in FIG. 8, in order to rotate the linear polarization direction of the laser beam LB2 having passed through the first Kerr cell 21 by about 90° by the half-wave plate 23, the laser beam LB2 having passed through the first Kerr cell 21 is perpendicularly incident on the half-wave plate 23 and the linear polarization direction of the laser beam LB2 forms an angle of about 45° with the phase delay axis (the slow axis) of the half-wave plate 23. The first Kerr cell 21 changes the path of a laser beam in the X direction. Accordingly, by rotating the half-wave plate 23 by a certain angle around the Z axis using the actuator, the laser beam LB2 having passed through the first Kerr cell 21 may be perpendicularly or approximately perpendicularly incident on the half-wave plate 23 and the linear polarization direction of the laser beam LB2 may form an angle of approximately or about 45° with the phase delay axis (the slow axis) of the half-wave plate 23.

Although the laser annealing apparatus is described as above, the disclosure is not limited thereto. For example, a laser annealing method using the laser annealing apparatus is included within the scope of the disclosure, and a method of manufacturing a substrate having a poly-Si layer using the laser annealing apparatus or a display apparatus manufacturing method using the laser annealing apparatus is also included within the scope of the disclosure.

Figure 10:
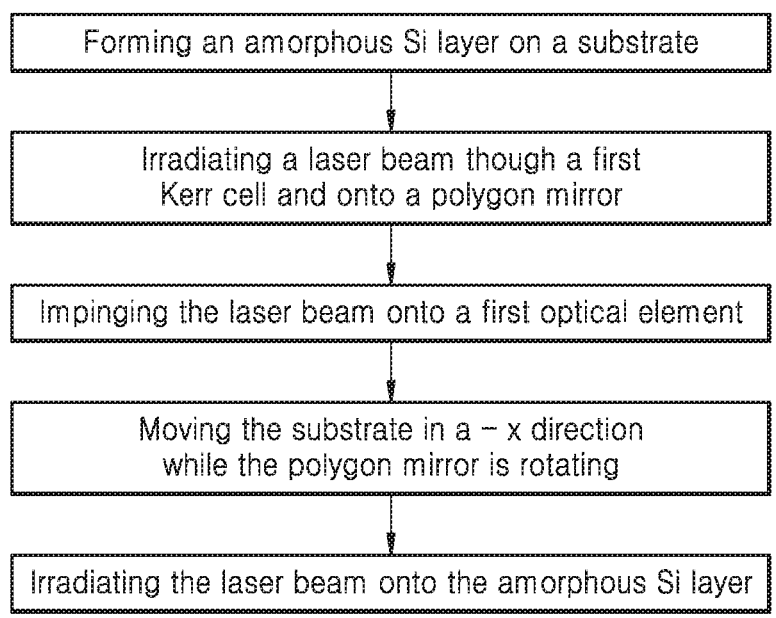
FIG. 10 is a flow chart of a method of manufacturing a substrate having a poly-Si layer.

For example, a method of manufacturing a substrate having a poly-Si layer according to an embodiment of the disclosure may include forming the amorphous Si layer 2 on the substrate 1 and irradiating a laser beam onto the amorphous Si layer 2 as illustrated in FIG. 1 and as illustrated in the flow chart of FIG. 10. The laser beam that is linearly polarized passes through the first Kerr cell 21, is reflected by the polygon mirror 30 that rotates around the rotation axis 30a, and passes through the first optical element 41 to be irradiated onto the amorphous Si layer 2. Accordingly, a laser beam path error that may occur in the polygon mirror 30 may be effectively prevented or reduced by using the first Kerr cell 21.

The polygon mirror 30 has the first reflection surface 31 and the second reflection surface 32. In the irradiation of the laser beam, the laser beam may be irradiated onto the amorphous Si layer 2 in a state in which the first potential difference applied to the first Kerr cell 21 while the laser beam is incident on the first reflection surface 31 is different from the second potential difference applied to the first Kerr cell 21 while the laser beam is incident on the second reflection surface 32. The above operation is described above with reference to FIGS. 4 and 5.

Alternatively, in the irradiation of the laser beam, the laser beam may be irradiated onto the amorphous Si layer 2 by varying the second potential difference applied to the first Kerr cell 21 while the polygon mirror 30 rotates and the laser beam is incident on the second reflection surface 32. The above operation is described above with reference to FIG. 6.

When the laser beam is irradiated, the laser beam is a linearly polarized laser beam, and the linear polarization P1 direction, as illustrated in FIG. 2, may be parallel to the direction (approximately, X direction) of the electric field generated in the first Kerr cell 21, located or disposed in the plane (approximately, the x-y plane) including the linear path of the laser beam incident on the first Kerr cell 21, and perpendicular to the linear path of the laser beam incident on the first Kerr cell 21.

In the irradiation of the laser beam, as illustrated in FIG. 8, the laser beam passes through the first Kerr cell 21, sequentially passes through the half-wave plate 23 and the second Kerr cell 22, and is incident on the polygon mirror 30 to be irradiated onto the amorphous Si layer 2. The direction (approximately, the Z direction) of the electric field generated in the second Kerr cell 22 may be perpendicular to the direction (approximately, the X direction) of the electric field generated in the first Kerr cell 21.

In the irradiation of the laser beam, as illustrated in FIG. 9, the laser beam may pass through the second optical element 42, may be incident on the polygon mirror 30, and may be irradiated onto the amorphous Si layer 2. The second optical element 42 allows the incidence point on the polygon mirror 30 of the laser beam that has passed through the second Kerr cell 22 to be identical or substantially identical to the incidence point on the polygon mirror 30 of the laser beam as if the second Kerr cell 22 does not exist or the optical path of a laser beam is not controlled. The above operation is described above with reference to FIG. 9. For example, the direction (approximately, the Z direction) of the electric field generated in the second Kerr cell 22 may be perpendicular to the rotation axis 30a of the polygon mirror 30.

The above-described laser annealing apparatus may be used to reduce a degree of defect generated in a poly-Si layer due to a defect of an optical element or constituent element.

For example, a defect may occur in a part of a surface of the first mirror 411 (referring to FIG. 1) having a convex reflection surface. In this case, if the first Kerr cell 21 does not exist or, otherwise, the optical path of a laser beam is not controlled, a poly-Si layer obtained by annealing the amorphous Si layer 2 may have an area affected by a defect of the first mirror 411. As the amorphous Si layer 2 is annealed while the stage moves the substrate 1 in the −X direction, the affected area of the poly-Si layer may have a linear shape approximately extending in the X direction. When a display apparatus is manufactured by using a substrate having a poly-Si layer, pixels on the area having a linear shape may have characteristics different from other pixels, which may be easily identified by a user.

When, in the laser annealing operation, the path of the laser beam is alternately changed in the +X direction and in the −X direction by using the first Kerr cell 21, even when the first mirror 411 has a defect, the area on the poly-Si layer that is affected by the defect may not have a linear shape approximately extending in the X direction, but a zigzag shape, for example. When a display apparatus is manufactured by using a substrate having such a poly-Si layer, a user may not easily identify such a zigzag shape. Thus, the above method may effectively prevent or reduce the generation or cause of a defect that may be identified by a user.

According to the above-described embodiment, a laser annealing apparatus which may obtain a previously intended result even when an error occurs in the shape of one constituent element, and a method of manufacturing a substrate having a poly-Si layer using the same, may be implemented. The scope of the disclosure, however, is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and scope may be made therein without departing from the spirit and scope as defined by the following claims.

What is claimed is:

1. A method of manufacturing a substrate having a poly-Si layer, the method comprising:
   forming an amorphous Si layer on a substrate;
   irradiating a linearly polarized laser beam onto the amorphous Si layer, after the linearly polarized laser beam passes through a first Kerr cell, is reflected by a polygon mirror that rotates around a rotation axis, and impinges on a first optical element; and
   adjusting an intensity of an electric field in the first Kerr cell to control path of the linearly polarized laser beam while the linearly polarized linear beam passes through the first Kerr cell.

2. The method of claim 1, further comprising moving the substrate in a predetermined direction while rotating the polygon mirror.

3. The method of claim 1, wherein
   in the irradiating of the laser beam onto the amorphous Si layer,
   applying a first potential difference to the first Kerr cell while the laser beam is incident on a first reflection surface of the polygon mirror, and
   applying a second potential difference to the first Kerr cell while the laser beam is incident on a second reflection surface of the polygon mirror,
   wherein the first and second potential differences differ from each other.

4. The method of claim 1, wherein
   in the irradiating of the laser beam, the laser beam is irradiated onto the amorphous Si layer by varying a second potential difference applied to the first Kerr cell while the polygon mirror rotates and the laser beam is incident on a second reflection surface of the polygon mirror.

5. The method of claim 1, wherein
   in the irradiating of the laser beam, the laser beam having a linear polarization direction is irradiated onto the amorphous Si layer through the first Kerr cell, and
   the linear polarization direction is in a plane parallel to a direction of the electric field generated in the first Kerr cell and including a linear path of the laser beam incident on the first Kerr cell, and is perpendicular to the linear path of the laser beam incident on the first Kerr cell.

6. The method of claim 1, wherein
   in the irradiating of the laser beam, the laser beam is irradiated onto the amorphous Si layer by passing through a second optical element between the first Kerr cell and the polygon mirror, and
   the second optical element makes an incidence point on the polygon mirror of the laser beam after passing through the first Kerr cell identical to an incidence point on the polygon mirror of the laser beam when the first Kerr cell is not disposed between the laser beam source and the polygon mirror.

7. The method of claim 6, wherein
in the irradiating of the laser beam, a direction of the electric field generated in the first Kerr cell is perpendicular to the rotation axis of the polygon mirror.

8. The method of claim 1, wherein
in the irradiating of the laser beam, the laser beam is irradiated onto the amorphous Si layer by sequentially passing through the first Kerr cell, a half-wave ($\lambda/2$) plate, and a second Kerr cell to be incident on the polygon mirror, and
a direction of an electric field generated in the second Kerr cell is perpendicular to a direction of the electric field generated in the first Kerr cell.

* * * * *